United States Patent
Kim

(10) Patent No.: US 9,722,580 B1
(45) Date of Patent: Aug. 1, 2017

(54) PROCESS INFORMATION EXTRACTOR CIRCUIT

(71) Applicant: SK hynix Inc., Gyeonggi-do (KR)

(72) Inventor: Jae-Heon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/208,344

(22) Filed: Jul. 12, 2016

(51) Int. Cl.
  *G05F 1/10* (2006.01)
  *G05F 3/02* (2006.01)
  *H03K 3/011* (2006.01)
  *G05F 3/08* (2006.01)

(52) U.S. Cl.
  CPC .............. *H03K 3/011* (2013.01); *G05F 3/08* (2013.01)

(58) Field of Classification Search
  CPC .................................. H03K 3/011; G05F 3/08
  USPC ........................................................ 327/541
  See application file for complete search history.

(56) References Cited

U.S. PATENT DOCUMENTS

| | | | | |
|---|---|---|---|---|
| 8,169,258 | B2* | 5/2012 | Lee | H03M 1/745 327/541 |
| 2003/0030579 | A1* | 2/2003 | Koo | H03M 1/48 341/164 |
| 2004/0239384 | A1* | 12/2004 | Cottin | H03F 3/3013 327/148 |
| 2005/0285698 | A1* | 12/2005 | Kim | H04L 25/0278 333/124 |
| 2006/0279345 | A1* | 12/2006 | Koo | H04L 25/0278 327/308 |

FOREIGN PATENT DOCUMENTS

KR    100650768    11/2006

* cited by examiner

*Primary Examiner* — Lincoln Donovan
*Assistant Examiner* — Metasebia Retebo
(74) *Attorney, Agent, or Firm* — IP & T Group LLP

(57) ABSTRACT

A process information extractor circuit includes: a transistor array including a plurality of transistors, and configured such that, among the plurality of transistors, the number of transistors electrically coupled in series is adjusted depending on a code; a current source suitable for adjusting the amount of current flowing through the transistor array to a predetermined value; a comparator suitable for comparing a gate voltage of the transistors electrically coupled in series in the transistor array, with a reference voltage; and a code generator suitable for generating the code according to a comparison result of the comparator.

14 Claims, 3 Drawing Sheets

PROCESS INFORMATION EXTRACTOR CIRCUIT

TECHNICAL FIELD

Exemplary embodiments of the present invention relate generally to an integrated circuit.

DISCUSSION OF THE RELATED ART

As is well known, process, voltage, and temperature (PVT) variation is very important in an integrated circuit. In particular, in highly integrated circuits employing low voltages and short transistor channels, it is very important to precisely determine process information of the integrated circuits.

SUMMARY

Various embodiments are directed to a technology of precisely measuring process information of an integrated circuit.

In an embodiment, a process information extractor circuit may include: a transistor array including a plurality of transistors, and configured such that, among the plurality of transistors, the number of transistors electrically coupled in series is adjusted depending on a code; a current source suitable for adjusting the amount of current flowing through the transistor array to a predetermined value; a comparator suitable for comparing a gate voltage of the transistors electrically coupled in series in the transistor array, with a reference voltage; and a code generator suitable for generating the code according to a comparison result of the comparator.

Among the plurality of transistors, transistors electrically coupled in series may have a diode-connected form.

The plurality of transistors may be PMOS transistors. The current source may adjust the amount of current sunk from the transistor array, to the predetermined value. In the case where, as a comparison result of the comparator, the gate voltage is higher than the reference voltage, the code generator may generate the code such that, among the plurality of transistors, the number of transistors electrically coupled in series is increased. In the case where, as a comparison result of the comparator, the gate voltage is lower than the reference voltage, the code generator may generate the code such that, among the plurality of transistors, the number of transistors electrically coupled in series is reduced.

The plurality of transistors may be NMOS transistors. The current source may adjust the amount of current sourced from the transistor array to the predetermined value. In the case where, as a comparison result of the comparator, the gate voltage is higher than the reference voltage, the code generator may generate the code such that, among the plurality of transistors, the number of transistors electrically coupled in series is reduced. In the case where, as a comparison result of the comparator, the gate voltage is lower than the reference voltage, the code generator may generate the code such that, among the plurality of transistors, the number of transistors electrically coupled in series is increased.

A value of the code when a difference between the gate voltage and the reference voltage is smallest may indicate process information.

In an embodiment, a process information extractor circuit may include: a PMOS transistor array including a plurality of PMOS transistors, and configured such that, among the plurality of PMOS transistors, the number of PMOS transistors electrically coupled in series is adjusted depending on a first code; a first current source suitable for adjusting the amount of current sunk from the PMOS transistor array, to a first value; a first comparator suitable for comparing a first gate voltage that is a gate voltage of the PMOS transistors electrically coupled in series in the PMOS transistor array, with a first reference voltage; a first code generator suitable for generating the first code according to a comparison result of the first comparator; an NMOS transistor array including a plurality of NMOS transistors and configured such that, among the plurality of NMOS transistors, the number of NMOS transistors electrically coupled in series is adjusted depending on a second code; a second current source suitable for adjusting the amount of current sourced to the NMOS transistor array, to a second value; a second comparator suitable for comparing a second gate voltage that is a gate voltage of the NMOS transistors electrically coupled in series in the NMOS transistor array, with a second reference voltage; and a second code generator suitable for generating the second code according to a comparison result of the second comparator.

Among the plurality of PMOS transistors, PMOS transistors electrically coupled in series may have a diode-connected form. Among the plurality of NMOS transistors, NMOS transistors electrically coupled in series may have a diode-connected form.

In the case where, as a comparison result of the first comparator, the first gate voltage is higher than the first reference voltage, the first code generator may generate the first code such that, among the plurality of PMOS transistors, the number of PMOS transistors electrically coupled in series is increased. In the case where, as a comparison result of the first comparator, the first gate voltage is lower than the first reference voltage, the first code generator may generate the first code such that, among the plurality of PMOS transistors, the number of PMOS transistors electrically coupled in series is reduced.

In the case where, as a comparison result of the second comparator, the second gate voltage is higher than the second reference voltage, the second code generator may generate the second code such that, among the plurality of NMOS transistors, the number of NMOS transistors electrically coupled in series is reduced. In the case where, as a comparison result of the second comparator, the second gate voltage is lower than the second reference voltage, the second code generator may generate the second code such that, among the plurality of NMOS transistors, the number of NMOS transistors electrically coupled in series is increased.

According to embodiments, process information of an Integrated circuit may be precisely measured.

DETAILED DESCRIPTION

Figure 1:
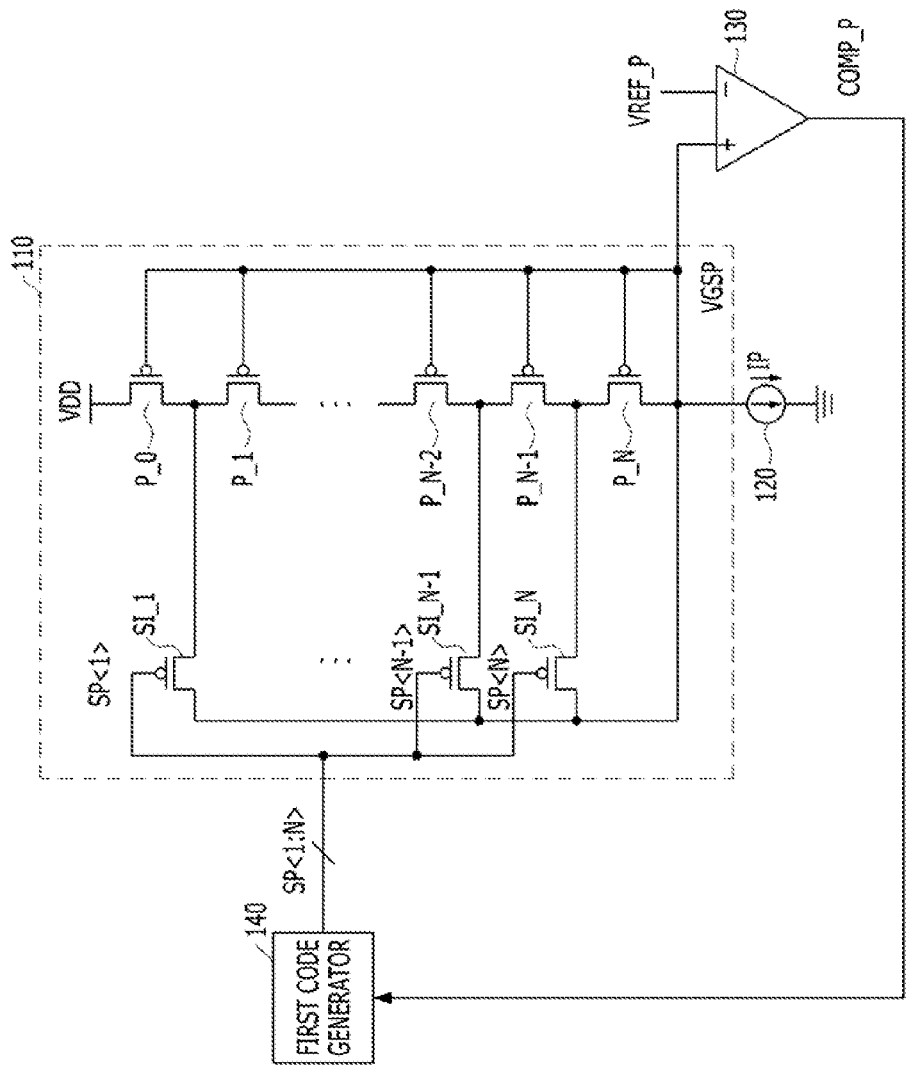
FIG. 1 is a diagram illustrating a configuration of a process information extractor circuit, in accordance with an embodiment of the present invention.

Various embodiments of the present invention will be described below in more detail with reference to the accompanying drawings. The present disclosure may, however, be embodied in different forms and should not be construed as being limited to the embodiments set forth herein. Rather, these embodiments are provided so that this disclosure will be thorough and complete, and will fully convey the present invention to those skilled in the art to which this invention pertains. Throughout the disclosure, like reference numerals refer to like parts throughout the various figures and embodiments of the present disclosure.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Referring now to FIG. 1 a configuration of a process information extractor circuit is provided, in accordance with an embodiment of the present invention.

According to the embodiment of FIG. 1, the process information extractor circuit may include a first transistor array 110, a first current source 120, a first comparator 130 and a first code generator 140.

The first transistor array 110 may include a plurality of transistors P_0 to P_N where N may be an arbitrary integer equal to or greater than 2. Among the plurality of transistors P_0 to P_N, the number of transistors that are electrically coupled in series may be adjusted depending on first codes SP<1:N>. Transistors S11 to S1_N may function as switches for adjusting the number of transistors that are coupled in series among the transistors P_0 to P_N. Each of the transistors P_0 to P_N and the transistors S1_1 to S1_N may be a PMOS transistor.

The transistors P_0 to P_N may receive an identical gate voltage VGSP, and the transistors P_0 to P_N may have a diode-connected form. For example, when all of the first codes SP<1:N> are '1' the transistors S1_1 to S1_N are turned off and thus all of the transistors P_0 to P_N may be electrically coupled between a power voltage terminal VDD and the gate voltage terminal VGSP. In another example where only the last one (i.e., SP<N>) in the first codes SP<1:N> is '0', the transistor S1_N is turned on and electrically isolates the transistor P_N from the other transistors P_0 to P_N−1 and thus the transistors P_0 to P_N−1 except for the transistor P_N may be electrically coupled between the power voltage terminal VDD and the gate voltage terminal VGSP. In another example where only the first one (i.e., SP<1>) in the first codes SP<1:N> is '0', the transistor S1_1 is turned on and electrically isolates the transistors P_1 to P_N from the first transistor P_0 and thus only the first transistor P_0 may be electrically coupled between the power voltage terminal VDD and the gate voltage terminal VGSP. As such, depending on the values of the first codes SP<1:N>, the number of transistors that are electrically coupled in series among the transistors P_0 to P_N between the power voltage terminal VDD and the gate voltage terminal VGSP may be adjusted.

The first current source 120 may adjust the amount of current flowing through the first transistor array 110 to a predetermined value IP. The first current source 120 may adjust the amount of current flowing through the transistors coupled in series among the transistors P_0 to P_N of the first transistor array 110 to the predetermined value IP by maintaining the amount of current sunk from the gate voltage terminal VGSP to the predetermined value IP.

The first comparator 130 may compare the gate voltage VGSP with a reference voltage VREF_P and output a comparison result COMP_P. For example, when the gate voltage VGSP is greater than the reference voltage VREF_P, the comparison result COMP_P may have a 'high' value. In the case where the gate voltage VGSP is less than the reference voltage VREF_P, the comparison result COMP_P may have a 'low' value.

The first code generator 140 may generate first codes SP<1:N> according to the comparison result COMP_P of the first comparator 130. The first code generator 140 may generate the first codes SP<1:N> based on the comparison result COMP_P so that the gate voltage VGSP and the reference voltage VREF_P are equal to each other. In the case where the gate voltage VGSP is greater than the reference voltage VREF_P, the first code generator 140 may adjust the first codes SP<1:N> so that the number of transistors which are electrically coupled in series is increased among the transistors P_0 to P_N. In the case where the gate voltage VGSP is lower than the reference voltage VREF_P, the first code generator 140 may adjust the first codes SP<1:N> so that the number of transistors which are electrically coupled in series is decreased among the transistors P_0 to P_N.

For example, when the comparison result COMP_P is 'high' while only one (e.g., SP<15>) in the first codes SP< > has a value of '0', the first code generator 140 may change the first codes SP<1:N> so that the next one (e.g., SP<16> of the code SP<15>) in the first codes SP<1:N> has a value of '0'. When the comparison result COMP_P is 'low' while only one (e.g., SP<20>) in the first codes SP<1:N> has a value of '0', the first code generator 140 may change the first codes SP<1:N> so that the previous one (e.g., SP<19> of the code SP<20>) in the first codes SP<1:N> has a value of '0'.

The comparison operation of the first comparator 130 and the operation of changing the first codes SP<1:N> in response to the comparison result COMP_P by the first code generator 140 may be periodically repeated.

In the case where transition of the comparison result COMP_P from 'high' to 'low' or from 'low' to 'high' is repeated a preset number of times or more, the first code generator 140 may determine that locking has been made and thus fix the values of the first codes SP<1:N>. In this case, the values of the first codes SP<1:N> at the time when a difference between the gate voltage VGSP and the reference voltage VREF_P is smallest, may indicate process information of an integrated circuit including the process information extractor circuit.

In a state in which the amount of current flowing through the first transistor array 110 is fixed at the predetermined value IP by the first current source 120, the greater that the number of transistors which are electrically coupled in series among the transistors P_0 to P_N of the first transistor array 110 becomes, the lower the gate voltage VGSP becomes. This is because, when the number of transistors coupled in series becomes greater, the gate voltage VGSP should be lowered so that the transistors can be strongly turned on to allow current of the predetermined value IP to flow.

On the other hand, in a state in which the amount of current flowing through the first transistor array 110 is fixed at the predetermined value IP by the first current source 120, the less the number of transistors which are electrically coupled in series among the transistors P_0 to P_N of the first transistor array 110 becomes, the greater the gate voltage VGSP becomes. This is because, when the number of transistors coupled in series becomes less, the gate voltage should rise so that the current of the predetermined value IP can flow even when the transistors are slightly turned on.

Under conditions in which the amount of current is fixed at the predetermined value IP and the number of transistors which are electrically coupled in series among the transistors P_0 to P_N of the first transistor array 110 is the same, the gate voltage VGSP becomes greater as the process has faster characteristics while the gate voltage VGSP becomes lower as the process has slower characteristics. Therefore, under a condition in which the gate voltage VGSP has almost the same level as the reference voltage VREF_P, the number of transistors coupled in series may be greater when the process is fast while the number of transistors coupled in series may become less when the process is slow.

Thus, after the values of the first codes SP<1:N> generated from the first code generator 140 have been locked, it may be determined that, when the number of transistors coupled in series in the first transistor array 110 is large, the process has fast characteristics, and, when the number of transistors coupled in series in the first transistor array 110 is small, the process has slow characteristics. For example, after the values of the first codes SP<1:N> have been locked, it may be determined that the process of the case where only the rear one (e.g., SP<20>) in the first codes SP<1:N> has a value of '0' has faster characteristics than that of the case where only the front one (e.g., SP<18>) in the first codes SP<1:N> has a value of '0'.

When the transistors used in the first transistor array 110 are PMOS transistors, the values of the first codes SP<1:N> after the locking has been made may reflect process characteristics pertaining to the PMOS transistors among the process characteristics of the Integrated circuit. Furthermore, although the values of the first codes SP<1:N>, after the locking has been made, mainly include process characteristics, temperature information may be reflected on the values of the first codes SP<1:N> after the locking because the fast or slow characteristics of the process are generally affected by temperature.

Figure 2:
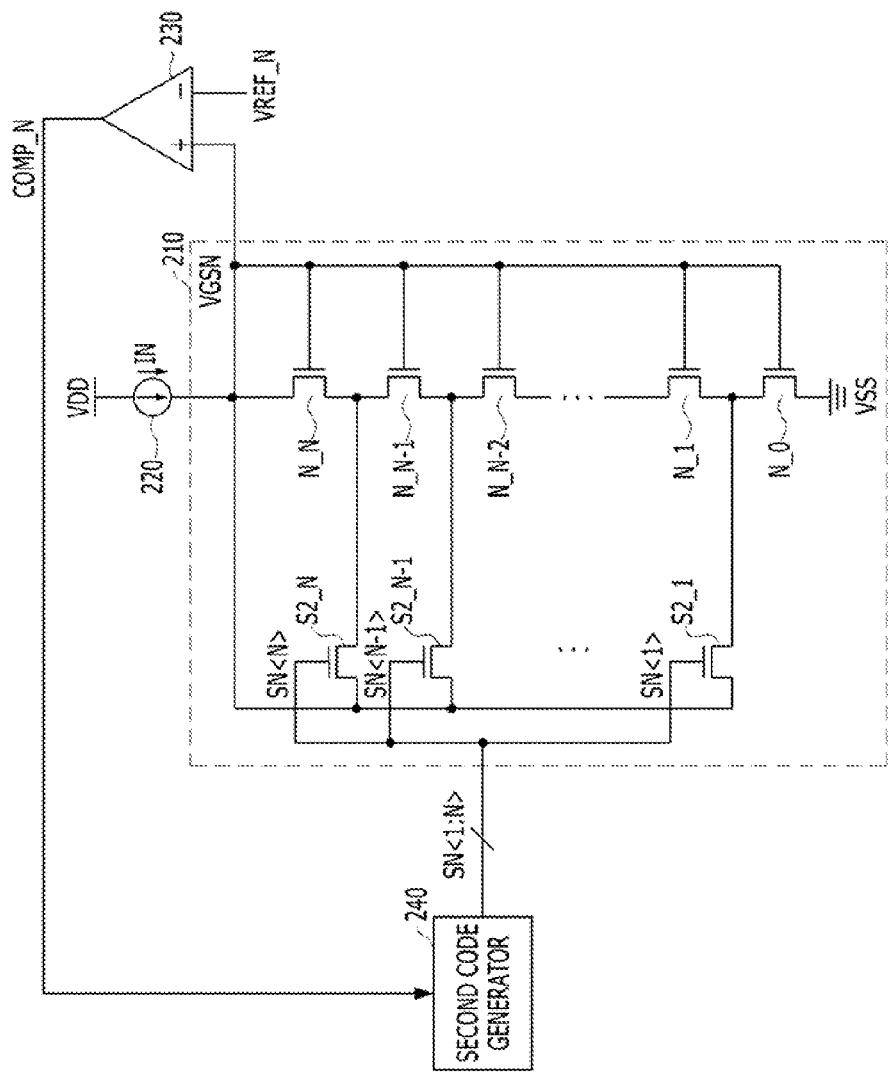
FIG. 2 is a diagram illustrating a configuration of a process information extractor circuit, in accordance with another embodiment of the present invention.

FIG. 2 is a diagram illustrating a configuration of a process information extractor circuit, in accordance with another embodiment of the present invention.

In the embodiment of FIG. 1, the PMOS transistors are used in the first transistor array 110, so that a relatively large amount of the characteristics of the PMOS transistors are reflected on the process information generated by the process information extractor circuit. However, in the embodiment of FIG. 2, NMOS transistors are used in a second transistor array 210, so that a relatively large amount of the characteristics of the NMOS transistors may be reflected on process 1o information generated by the process information extractor circuit.

Referring to FIG. 2, the process information extractor circuit may include the second transistor array 210, a second current source 220, a second comparator 230 and a second code generator 240.

The second transistor array 210 may include a plurality of transistors N_0 to N_N. Among the plurality of transistors N_0 to N_N, the number of transistors which are electrically coupled in series may be adjusted depending on second codes SN<1:N>. Transistors S2_1 to S2_N may function as switches for adjusting the number of transistors that are coupled in series among the transistors N_0 to N_N. Each of the transistors N_0 to N_N and the transistors S2_1 to S2_N may be an NMOS transistor.

The transistors N_0 to N_N may receive an identical gate voltage VGSN, and the transistors N_0 to N_N may have a diode-connected form. In an example, all of the second codes SN<1:N> are '0', the transistors S2_1 to S2_N are therefore turned off, and thus all of the transistors N_0 to N_N may be electrically coupled between the gate voltage terminal VGSN and a ground voltage terminal VSS. In another example where only the last one (i.e., SN<N>) in the second codes SN<1:N> is '1', the transistor S2_N is turned on and electrically isolates the transistor N_N from the other transistors N_0 to N_N−1 and thus the transistors N_0 to N_N−1 except for the transistor N_N may be electrically coupled between the gate voltage terminal VGSN and the ground voltage terminal VSS. In another exemplary case where only the first one (i.e., SN<i>) in the second codes SN<1:N> is '1', the transistor S2_1 is turned on and electrically isolates the transistors N_1 to N_N from the first transistor N_0 and thus only the first transistor N_0 may be electrically coupled between the gate voltage terminal VGSN and the ground voltage terminal VSS. As such, depending on the values of the second codes SN<1:N> the number of transistors that are electrically coupled in series among the transistors N_0 to N_N between the gate voltage terminal VGSN and the ground voltage terminal VSS may be adjusted.

The second current source 220 may adjust the amount of current flowing through the second transistor array 210 to a predetermined value IN. The second current source 220 may adjust the amount of current flowing through the transistors coupled in series among the transistors N_0 to N_N of the second transistor array 210 to the predetermined value IN by maintaining the amount of current sourced to the gate voltage terminal VGSN to the predetermined value IN.

The second comparator 230 may compare the gate voltage VGSN with a reference voltage VREF_N and output a comparison result COMP_N. In the case where the gate voltage VGSN is greater than the reference voltage VREF_N, the comparison result COMP_N may have a 'high' level. In the case where the gate voltage VGSN is less than the reference voltage VREF_N, the comparison result COMP_N may have a 'low' level.

The second code generator 240 may generate second codes SN<1:N> according to the comparison result COMP_N of the second comparator 230. The second code generator 240 may generate the second codes SN<1:N> based on the comparison result COMP_N so that the gate voltage VGSN and the reference voltage VREF_N can be equalized. In the case where the gate voltage VGSN is greater than the reference voltage VREF_N, the second code generator 240 may adjust the second codes SN<1:N> so that the number of transistors which are electrically coupled in series is decreased among the transistors N_0 to N_N. In the case where the gate voltage VGSN is lower than the reference voltage VREF_N, the second code generator 240 may adjust the second codes SN<1:N> so that the number of transistors which are electrically coupled in series is increased among the transistors N_0 to N_N.

For example, when the comparison result COMP_N is 'high' while only one (e.g., SP<15>) in the second codes SN<1:N> has a value of '1', the second code generator 240 may change the second codes SN<1:N> such that the previous one (e.g., SP<14> of the code SP<15>) in the second codes SN<1:N> has a value of '1'. When the comparison result COMP_N is 'low' while only one (e.g., SP<20>) in the second codes SN<1:N> has a value of '1', the second code generator 240 may change the second codes SN<1:N> such that the next one (e.g., SP<21> of the code SP<20>) in the second codes SN<1:N> has a value of '1'.

The comparison operation of the second comparator 230 and the operation of changing the second codes SN<1:N> in response to the comparison result COMP_N by the second code generator 240 may be periodically repeated.

In the case where transition of the comparison result COMP_N from 'high' to 'low' or from 'low' to 'high' is repeated a preset number of times or more, the second code generator 240 may determine that locking has been made and thus fix the values of the second codes SN<1:N>. In this case, the values of the second codes SN<1:N> at the time when a difference between the gate voltage VGSN and the reference voltage VREF_N is smallest, may indicate process information of an integrated circuit including the process information extractor circuit.

In a state in which the amount of current flowing through the second transistor array 210 is fixed at the predetermined value IN by the second current source 220, the greater the number of transistors which are electrically coupled in series among the transistors N_0 to N_N of the second transistor array 210 may become, the greater the gate voltage VGSN may become. Because, when the number of transistors coupled in series becomes greater, the gate voltage VGSN should rise so that the transistors can be strongly turned on and thus current of the predetermined value IN can flow.

On the other hand, in a state in which the amount of current flowing through the second transistor array 220 is fixed at the predetermined value IN by the second current source 220, the less the number of transistors which are electrically coupled in series among the transistors N_0 to N_N of the first transistor array 210 may become, the lower the gate voltage VGSN may become. Because, when the number of transistors coupled in series becomes less, the gate voltage should be lowered so that current of the predetermined value IN can flow even when the transistors are slightly turned on.

Under conditions in which the amount of current is fixed at the predetermined value IN and the number of transistors which are electrically coupled in series among the transistors N_0 to N_N of the second transistor array 210 is the same, the gate voltage VGSN may become lowered as the process has faster characteristics while the gate voltage VGSN may become greater as the process has slower characteristics. Therefore, under a condition in which the gate voltage VGSN has almost the same level as the reference voltage VREF_N the number of transistors coupled in series may be greater when the process is fast while the number of transistors coupled in series may become less when the process is slow.

Thus, after the values of the second codes SN<1:N> generated from the second code generator 240 have been locked, it may be determined that, when the number of transistors coupled in series in the second transistor array 210 is large, the process has fast characteristics, and, when the number of transistors coupled in series in the second transistor array 210 is small, the process has slow characteristics. For example, after the values of the second codes SN<1:N> have been locked, it may be determined that the process of the case where only the rear one (e.g., SP<20>) in the second codes SN<1:N> has a value of '1' has faster characteristics than that of the case where only the front one (e.g., SP<18>) in the second codes SN<1:N> has a value of '1'.

When the transistors used in the second transistor array 210 are NMOS transistors, the values of the second codes SN<1:N> after locking has been made may reflect process characteristics pertaining to the NMOS transistors among process characteristics of the integrated circuit. Furthermore, although the values of the second codes SN<1:N> after the locking has been made mainly includes process characteristics, temperature information may be reflected on the values of the second code SN<1:N> after the locking because the fast or slow characteristics of the process is generally affected by temperature.

Figure 3:
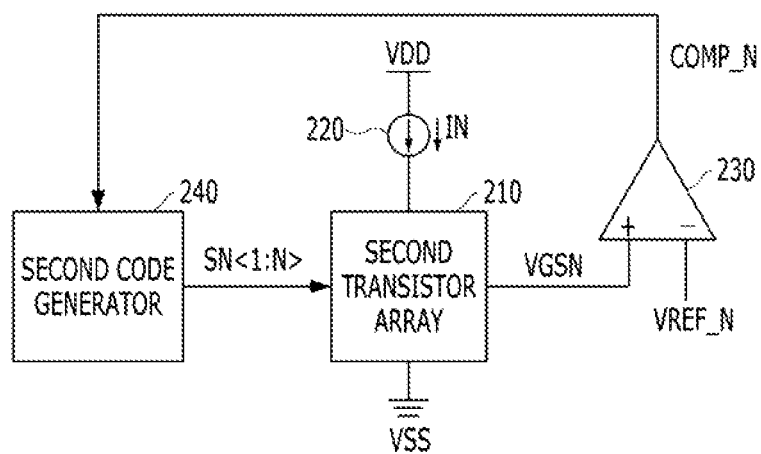
FIG. 3 is a diagram illustrating a configuration of a process information extractor circuit, in accordance with yet another embodiment of the present invention.
Figure 3:
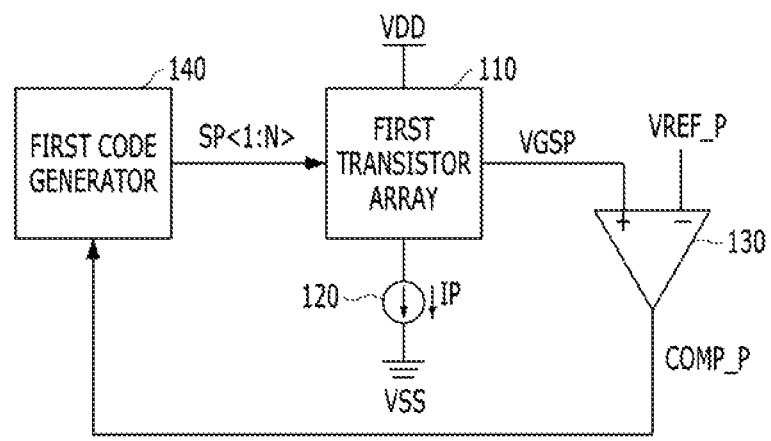

Referring to FIG. 3 a configuration of a process information extractor circuit is provided, in accordance with yet another embodiment of the present invention.

The embodiment of FIG. 3 may include the first transistor array 110, the first current source 120, the first comparator 130 and the first code generator 140 of the embodiment of FIG. 1, and the second transistor array 210, the second source 220, the second comparator 230 and the second coder generator 240 of the embodiment of FIG. 2. In the embodiment of FIG. 3, it may be possible to detect accurate process information reflecting the characteristics of both of the PMOS and NMOS transistors by generating first and second codes SP<1:N> and SN<1:N>.

Although various embodiments have been described for illustrative purposes, it will be apparent to those skilled in the art that various changes and modifications may be made without departing from the spirit and scope of the present invention as defined in the following claims.

What is claimed is:

1. A process information extractor circuit comprising:
a transistor array including a plurality of transistors having a common gate voltage, and configured such that, among the plurality of transistors, the number of transistors electrically coupled in series is adjusted depending on a code;
a current source suitable for adjusting an amount of current flowing through the transistors electrically coupled in series to a predetermined value;
a comparator suitable for comparing a reference voltage with the common gate voltage; and
a code generator suitable for generating the code according to a comparison result of the comparator.

2. The process information extractor circuit according to claim 1, wherein the transistors electrically coupled in series have a diode-connected form.

3. The process information extractor circuit according to claim 2, wherein the plurality of transistors are PMOS transistors.

4. The process information extractor circuit according to claim 3, wherein the current source adjusts the amount of current sunk from the transistors electrically coupled in series to the predetermined value.

5. The process information extractor circuit according to claim 3,
wherein the code generator generates the code so that the number of transistors electrically coupled in series is increased when the common gate voltage is greater than the reference voltage, and
wherein the code generator generates the code so that the number of transistors electrically coupled in series is decreased when the common gate voltage is lower than the reference voltage.

6. The process information extractor circuit according to claim 5, wherein a value of the code indicates a process information when a difference between the gate voltage and the reference voltage is smallest.

7. The process information extractor circuit according to claim 2, wherein the plurality of transistors are NMOS transistors.

8. The process information extractor circuit according to claim 7, wherein the current source adjusts the amount of current sourced to the transistors electrically coupled in series to the predetermined value.

9. The process information extractor circuit according to claim 7,
wherein, when the common gate voltage is greater than the reference voltage, the code generator generates the code such that the number of transistors electrically coupled in series is decreased, and
wherein, when the gate voltage is lower than the reference voltage, the code generator generates the code such that the number of transistors electrically coupled in series is increased.

10. The process information extractor circuit according to claim 9, wherein a value of the code indicates a process information when a difference between the gate voltage and the reference voltage is smallest.

11. An integrated circuit comprising:
a PMOS transistor array including a plurality of PMOS transistors having a first common gate voltage, and configured such that, among the plurality PMOS transistors, the number of PMOS transistors electrically coupled in series is adjusted depending a first code;
a first current source suitable for adjusting an amount of current sunk from the PMOS transistors electrically coupled in series to a first value;
a first comparator suitable for comparing a first reference voltage with the first common gate voltage;
a first code generator suitable for generating the first code according to a comparison result of the first comparator;
an NMOS transistor array including a plurality of NMOS transistors having a second common gate voltage, and configured such that, among the plurality NMOS transistors, the number of NMOS transistors electrically coupled in series is adjusted depending a second code;
a second current source suitable for adjusting an amount of current sourced to the NMOS transistors electrically coupled in series to a second value;
a second comparator suitable for comparing a second reference voltage with the second common gate voltage; and
a second code generator suitable for generating the second code according to a comparison result of the second comparator.

12. The integrated circuit according to claim 11,
wherein the PMOS transistors electrically coupled in series have a diode-connected form, and
wherein the NMOS transistors electrically coupled in series have a diode-connected form.

13. The integrated circuit according to claim 11,
wherein, when the first common gate voltage is greater than the first reference voltage, the first code generator generates the first code such that the number of PMOS transistors electrically coupled in series is increased, and
wherein, when the first common gate voltage is lower than the first reference voltage, the first code generator generates the first code such that the number of PMOS transistors electrically coupled in series is decreased.

14. The integrated circuit according to claim 11,
wherein, when the second common gate voltage is greater than the second reference voltage, the second code generator generates the second code such that the number of NMOS transistors electrically coupled in series is decreased, and
wherein, when the second common gate voltage is lower than the second reference voltage, the second code generator generates the second code such that the number of NMOS transistors electrically coupled in series is increased.

* * * * *